United States Patent
Huang et al.

(10) Patent No.: US 7,399,965 B2
(45) Date of Patent: Jul. 15, 2008

(54) METHOD OF DETECTING ARRAY OF LIQUID CRYSTAL DISPLAY AND APPARATUS THEREOF

(75) Inventors: Ting-Hui Huang, Gueishan Township, Taoyuan County (TW); Kuo-Kuei Lee, Gueishan Township, Taoyuan County (TW); Chih-Chiang Chen, Gueishan Township, Taoyuan County (TW); Feng-Lung Chang, Gueishan Township, Taoyuan County (TW)

(73) Assignee: Au Optronics Corp., Hsinchu (TW)

( * ) Notice: Subject to any disclaimer, the term of this patent is extended or adjusted under 35 U.S.C. 154(b) by 367 days.

(21) Appl. No.: 11/235,602

(22) Filed: Sep. 26, 2005

(65) Prior Publication Data

US 2006/0163476 A1 Jul. 27, 2006

(30) Foreign Application Priority Data

Jan. 26, 2005 (TW) .............................. 94102301 A

(51) Int. Cl.
*H01J 37/00* (2006.01)
(52) U.S. Cl. ...................................... 250/310; 324/770
(58) Field of Classification Search ................ 250/310; 324/770, 751, 752, 753, 754
See application file for complete search history.

(56) References Cited

U.S. PATENT DOCUMENTS

| 5,233,191 A | * | 8/1993 | Noguchi et al. | ............. 250/306 |
| 5,309,108 A | * | 5/1994 | Maeda et al. | ................ 324/501 |
| 5,844,249 A | | 12/1998 | Takano et al. | .......... 250/559.34 |
| 6,545,500 B1 | | 4/2003 | Field | ......................... 324/770 |

FOREIGN PATENT DOCUMENTS

| JP | 01-292736 | 11/1989 |
| JP | H0215235 | 1/1990 |
| JP | 06102193 | 4/1994 |
| JP | 11202361 | 7/1999 |
| JP | 2000047163 | 2/2000 |

OTHER PUBLICATIONS

Taiwan Search Report issued May 5, 2006.
Japan Office Action mailed Oct. 16, 2006.
JP Office Action mailed Feb. 8, 2007.

* cited by examiner

*Primary Examiner*—Kiet T Nguyen
(74) *Attorney, Agent, or Firm*—Thomas, Kayden, Horstemeyer & Risley

(57) ABSTRACT

A detection apparatus for detecting a defect in an array of a liquid crystal display, comprises a main chamber, a stage, a detection device and a main heater. The stage is disposed in the main chamber, and the array is placed on stage. The detection device is disposed in the main chamber and detects an electrical characteristic of the array. The main heater heats the array to a first temperature to reveal the defect of the array.

22 Claims, 6 Drawing Sheets

METHOD OF DETECTING ARRAY OF LIQUID CRYSTAL DISPLAY AND APPARATUS THEREOF

BACKGROUND

The invention relates to a detecting method, and more particularly to a method of detecting an array of a liquid crystal display.

Conventionally, a defect in an array of a liquid crystal display (for example, a thin film transistor liquid crystal display, TFT LCD) is detected by contact detection (for example, probe detection) or non-contact detection (for example, electron beam or optical detection). FIG. 1 shows a pixel P1 of an array of a TFT LCD detected by an electron beam, wherein pixel P1 comprises a transparent electrode D1, a thin film transistor T1 and a capacitance C1. In electron beam detection, a voltage is applied to transparent electrode D1, and an electron source 11 emits an electron beam toward transparent electrode D1. The electron beam is generated by transparent electrode D1 and produces secondary electrons. Secondary electrons are received by a sensor 12. An array defect (for example, a data line break or a short between a transparent electrode and a data line) increases positive or negative electric charges on transparent electrode D1, and changes a quantity of secondary electrons received by sensor 12 (due to repulsion between same charges and attraction between different charges). Thus, array defects are detected by examining the quantity of secondary electrons received by sensor 12.

Conventional detection methods, however, cannot completely detect all defects of a thin film transistor, such as high-temperature defects (defect revealed only at high temperature, for example, "TFT weak"). The term "TFT weak" is described here after. FIG. 2 shows performance curves of thin film transistors. Dotted curve 20 is a performance curve of an ideal thin film transistor. Under ideal circumstances, when a current input is lower than a threshold voltage, current flux of the thin film transistor is low, and a light path in a liquid crystal layer (not shown) is closed. When current input is higher than a threshold voltage, current flux of the thin film transistor is increased, and light path in the liquid crystal layer is open. Curve 21 is a performance curve of a normal thin film transistor. Normal circumstances are similar to ideal circumstances, wherein the light path in the liquid crystal layer is opened only when current input is higher than threshold voltage. Curve 22 is a performance curve of a weak thin film transistor which leaks current when temperature thereof increases, wherein current flux of the thin film transistor is too high when current input is lower than threshold voltage. In normal white mode, a weak TFT constantly opens light path, and the liquid crystal display shows bright point(s) (bright point defect) when displaying an all-black image. In normal black mode, a weak TFT constantly closes the light path, and liquid crystal display shows a dark point (black point defect) when displaying an all-white image.

When a liquid crystal display operates, a backlight module thereof heats the liquid crystal display array. Thus, if a high-temperature defect exists in the TFT, bright point defects or black point defects are revealed. Conventional array detection is performed directly after an array process without being exposed to heat. Thus, high-temperature defects cannot be found by conventional detection. In practice, high-temperature defects are conventionally discovered after a cell process and a backlight module packing process, and the cost of reworking or nullifying defective liquid crystal displays is quite high.

SUMMARY

According to the present invention, a detection apparatus is provided. The detection apparatus for detecting a defect of an array in a liquid crystal display, comprises a main chamber, a stage, a detection device and a main heater. The stage is disposed in the main chamber, and the array is placed on the stage. The detection device is disposed in the main chamber and detects an electrical characteristic of the array. The main heater heats the array to a first temperature to reveal the defect in the array.

The apparatus of the invention locates the defect of the TFT directly after an array process, especially defects highly related to the high temperature. Therefore, the TFT with the defects can be repaired before a cell process and a backlight module packaging process. The cost for manufacturing a panel is apparently reduced.

BRIEF DESCRIPTION OF THE DRAWINGS

The present invention will become more fully understood from the following detailed description and the accompanying drawings, given by the way of illustration only and thus not intended to limit the disclosure.

DETAILED DESCRIPTION

The apparatus of the invention heats an array in a liquid crystal display when detection of the array reveals a defect, especially a high-temperature defect. Additionally, the apparatus of the invention detects elements electrically related to a TFT of the array to detect defects in the TFT.

First Embodiment

Figure 1:
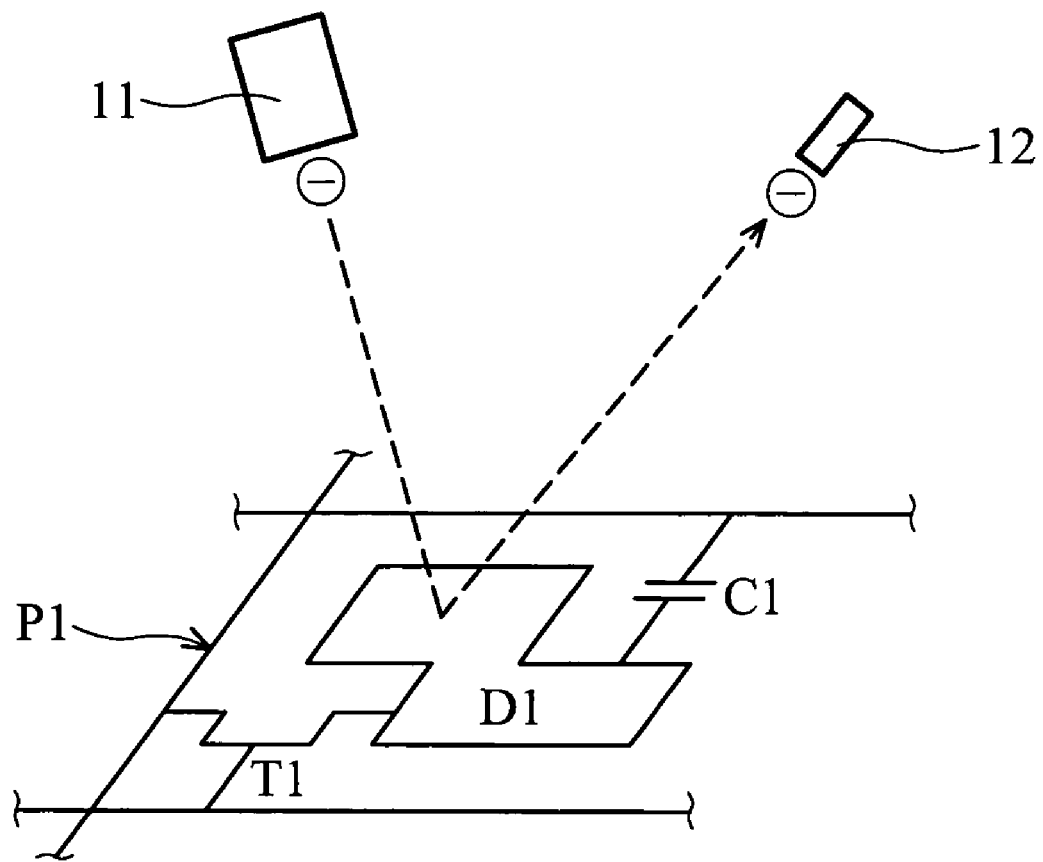
FIG. 1 shows a pixel of a TFT LCD detected by an electron beam.
Figure 2:
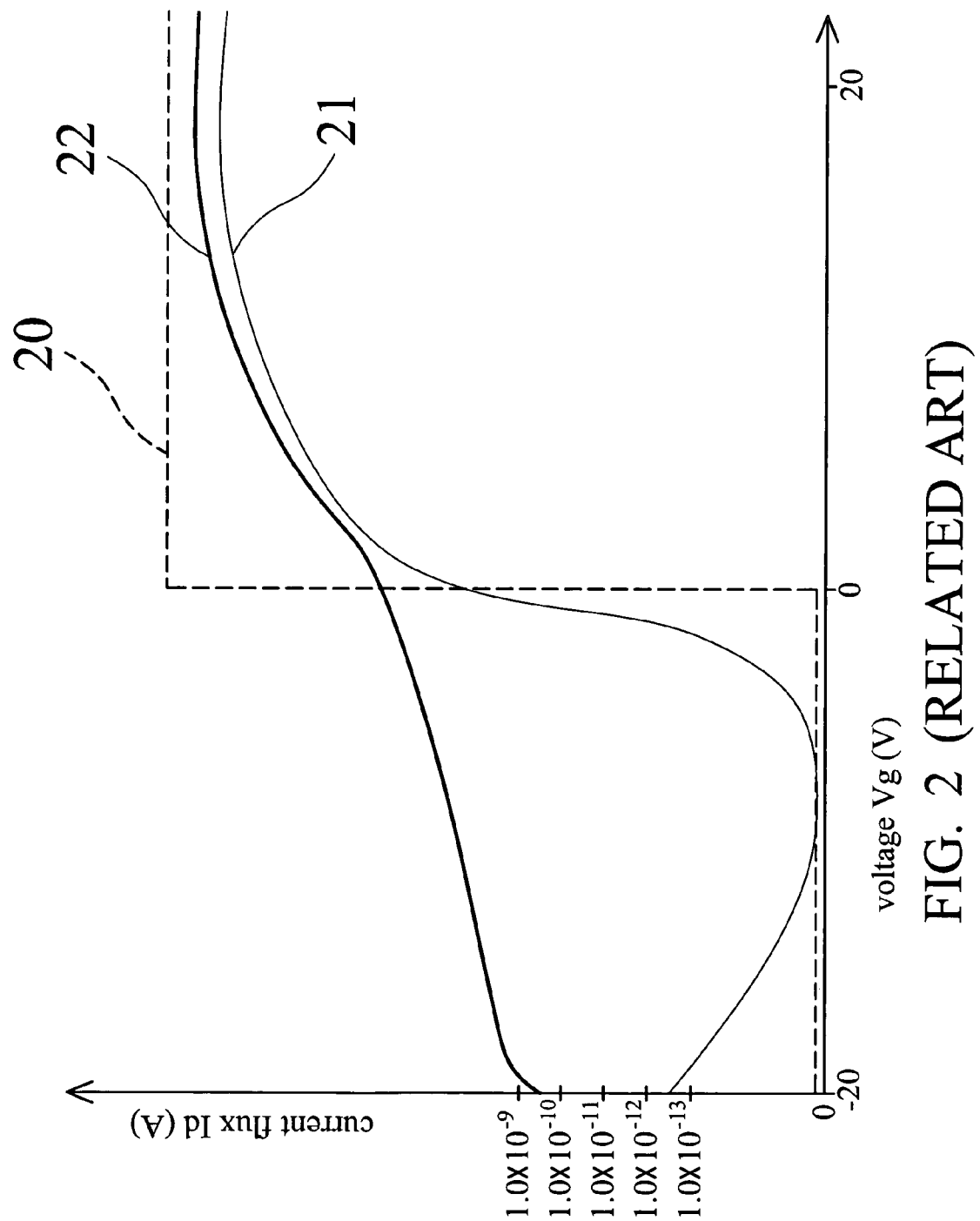
FIG. 2 shows performance curves of thin film transistors.
Figure 3A:
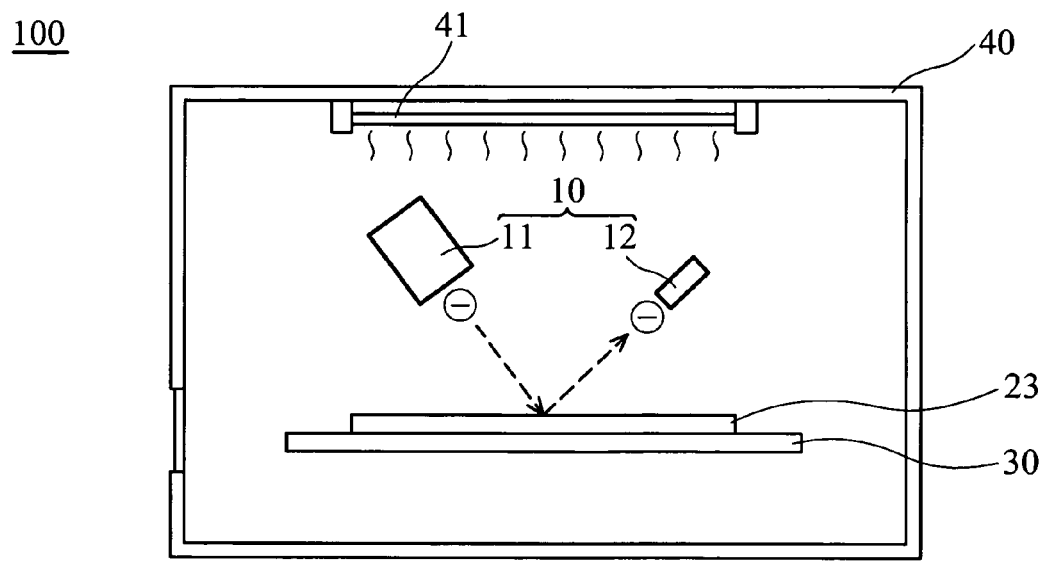
FIG. 3a shows a first embodiment of the invention.

FIG. 3a shows a detection apparatus 100 of a first embodiment of the invention, which comprises a main chamber 40, a detection device 10, a stage 30 and a heater (lamp 41). The detection device 10 and the stage 30 are disposed in the main chamber 40. The array 23 is placed on the stage 30. The detection device 10 is an electron beam detection device, which comprises an electron beam source 11 and a sensor 12. The electron beam source 11 emits an electron beam toward a transparent electrode (not shown) of the array 23. The sensor 12 senses secondary electrons generated from the array 23 to detect an electrical characteristic of the array 23. Additionally, the main chamber 40 is a vacuum chamber for electron beam detecting.

The defect detection method of the first embodiment is as follows. First, the array 23 is disposed in the main chamber 40. Then, the lamp 41 heats the array 23 to a first temperature by radiation. Finally, the detection device 10 detects the electrical characteristic of the array 23. The first temperature is between 20 to 150° C., preferably 60° C.

The apparatus of the invention heats the array 23 to reveal a defect of the array, especially a defect related to high temperature (high-temperature defect), such as TFT weak. The defect of TFT causes current leakage at a first temperature and changes the electrical characteristic of the transparent electrode. Therefore, by the method of the invention, the high-temperature defect of the array is detected.

Figure 3B:
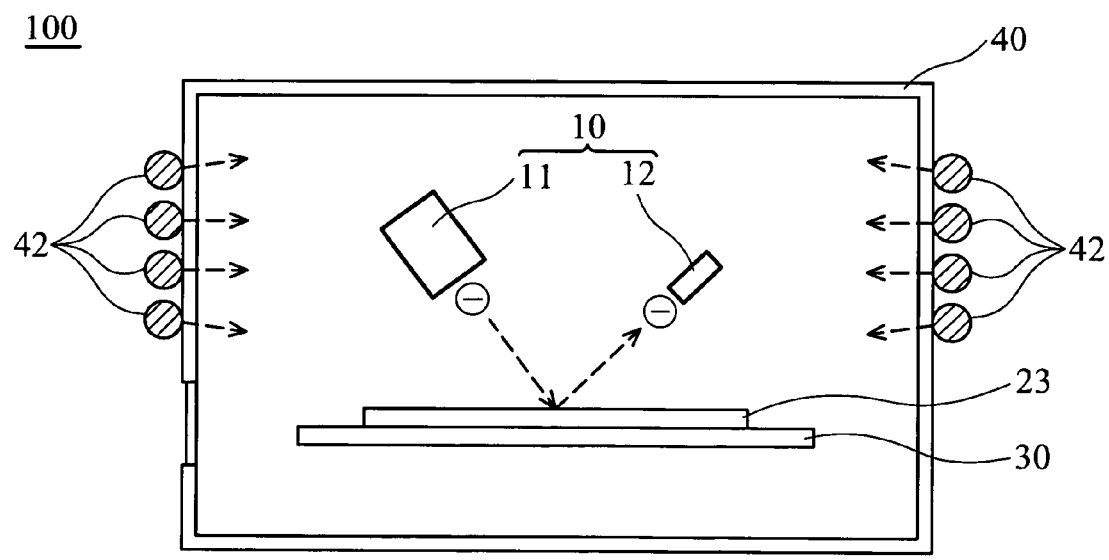
FIG. 3b shows a first modified example of the first embodiment of the invention.

FIG. 3b shows a first modified example of the first embodiment, wherein the lamp is replaced by heating coil 42. The heating coils 42 are disposed on an outer surface of the main chamber 40, and heat the array 23 by cold wall heating.

Figure 3C:
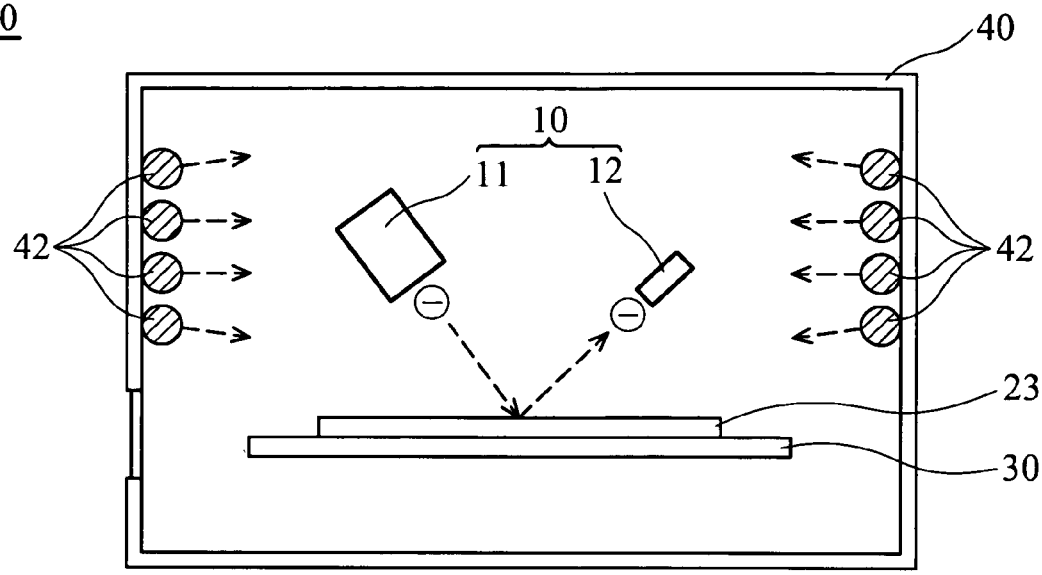
FIG. 3c shows a second modified example of the first embodiment of the invention.

FIG. 3c shows a second modified example of the first embodiment, wherein the lamp is replaced by heating coils 42. The heating coils 42 are disposed on an inner surface of the main chamber 40, and heat the array 23 by hot wall heating. The hot wall heating is an example of radiation heating.

Figure 3D:
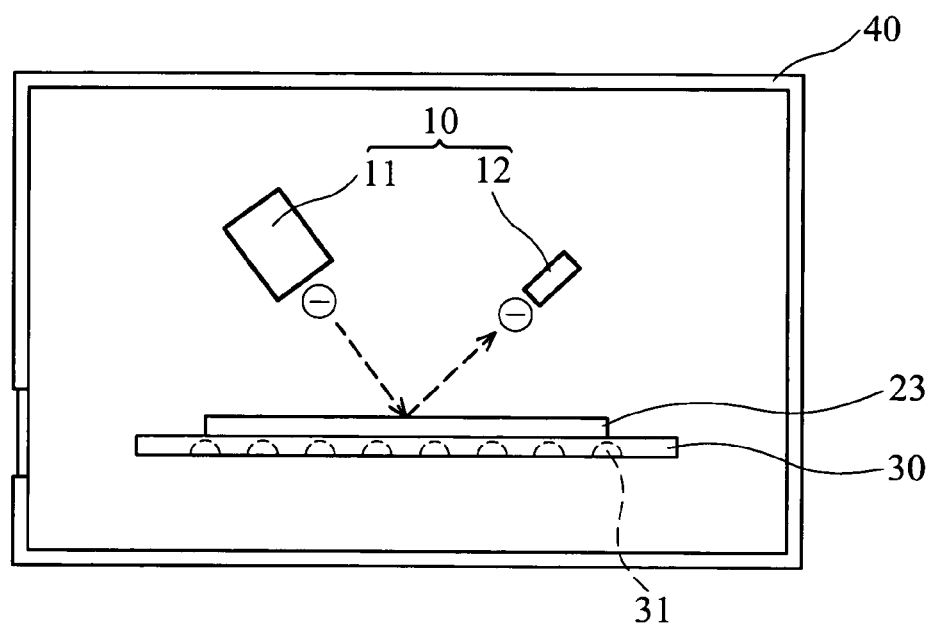
FIG. 3d shows a third modified example of the first embodiment of the invention.

FIG. 3d shows a third modified example of the first embodiment, wherein the lamp is replaced by heating coil 31. The heating coils 31 are imbedded in the stage 30, and heat the stage 30 by conducting to heat the array 23.

The heating coils 31 in FIG. 3d are not limited to imbedding in the stage 30. The heating coils 31 can also be disposed on the stage 30 and heat the array by conduction. The heating coils 31 can also be disposed near the array 23 and heat the array by radiation.

Additionally, in the first embodiment, the heating device can uniformly preheat the array 23 to a second temperature. The second temperature is lower than the first temperature, between 20 to 150° C., preferably 40° C. Preheating the array 23 prevents a glass substrate (not shown) of the array 23 from cracking due to heat. The preheating is utilized in a non-vacuum environment (in the main chamber 40); thus, the array 23 is heated by radiation, conduction, or a combination there of to increase heating speed. After preheating, a vacuum environment is provided (still in the main chamber 40) and the array 23 is heated to the first temperature by radiation.

After the defect detection, the array 23 is uniformly cooled to the second temperature by controlling the heating device to prevent the glass substrate of the array from cracking. After the temperature of the array is reduced to the second temperature, the vacuum environment is broken, and the array 23 is further cooled by convection or conduction for speeding cooling process.

The apparatus of the invention detects the array by electron beam in vacuum environment. However, other contact (for example, probe detecting) or non-contact methods to detect defects in the array can also be utilized. The defect detection is not limited to use of a vacuum environment, and the heating device can selectively utilize radiation, convection or conduction to heat the array according to different detection methods.

The liquid crystal display is an amorphous silicon TFT LCD, a poly-silicon TFT LCD, an active-matrix organic electroluminescent display or a active-matrix flat panel display.

Second Embodiment

Figure 4A:
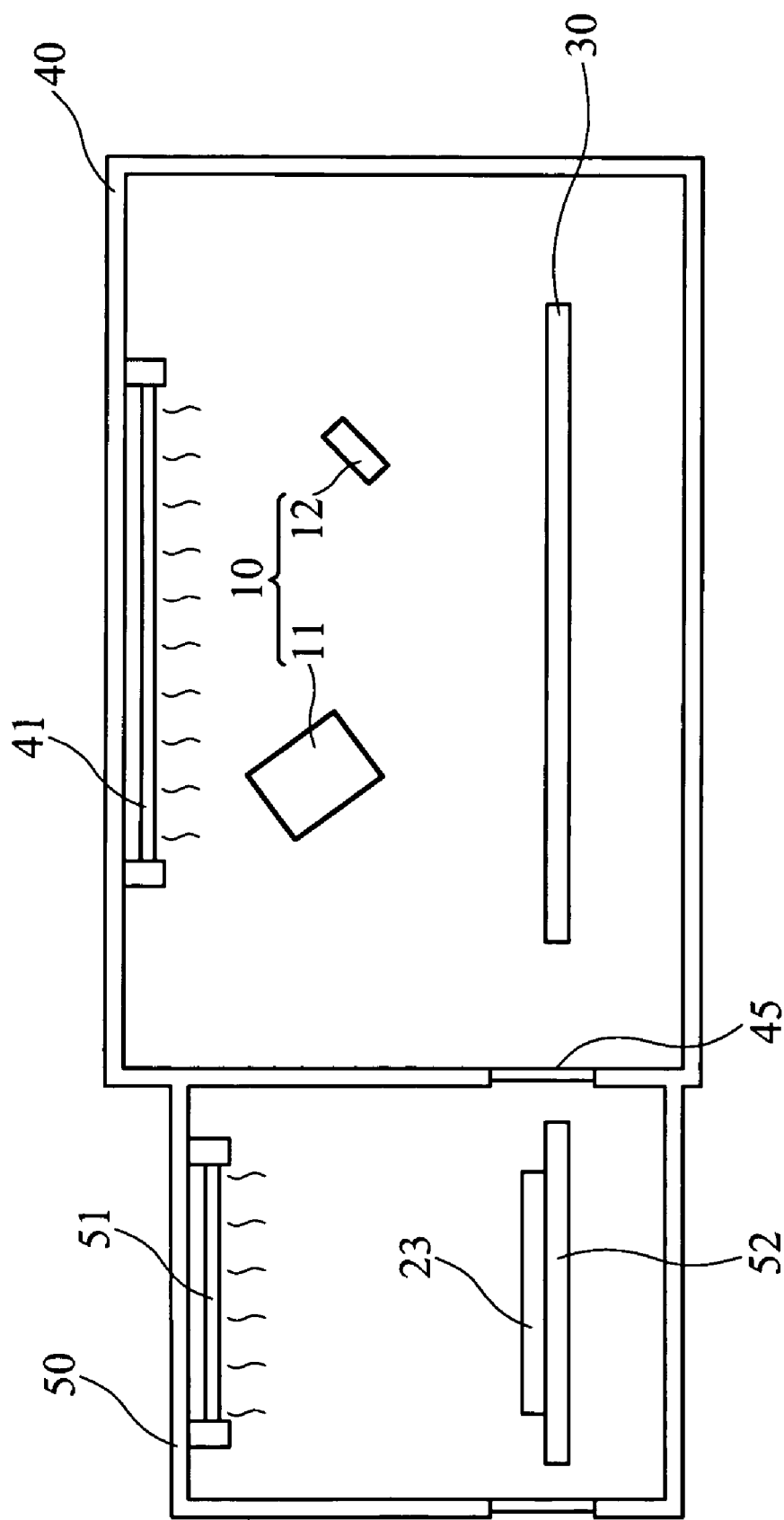
FIG. 4a shows a second embodiment of the invention.

FIG. 4a shows a second embodiment of the invention. The second embodiment of the invention further comprises a subchamber 50 to reduce thermal stress and speed up the heating and cooling process. A heating device (lamp 41) in the main chamber 40 is named "main heater", and a heating device (lamp 51) in the subchamber 50 is named "subheater" here after to clarify the description. In the second embodiment, the main heater and the subheater are lamps. Any one of the heating means in the first embodiment, however, can be utilized. The subchamber 50 comprises the subheater 51 and a stage 52 disposed therein. A channel 45 selectively connects the subchamber 50 to the main chamber 40.

Before defect detection, the array 23 is placed on the stage 52 in the subchamber 50 for heating to the second temperature. Then, the array is moved through the channel 45 into the main chamber 40 for heating to the first temperature. After defect detection, the array 23 is moved back to the subchamber 50 and uniformly cooled to the second temperature. After the temperature of the array reaches the second temperature, the array is removed from the subchamber 50. The subchamber is a non-vacuum environment, and the array 23 is heated and cooled by convection, radiation conduction or a combination there of. Therefore, the heating and cooling times of the array are reduced, the heating and cooling uniformity of the array are improved, and the glass substrate of the array 23 is prevented from cracking.

Figure 4B:
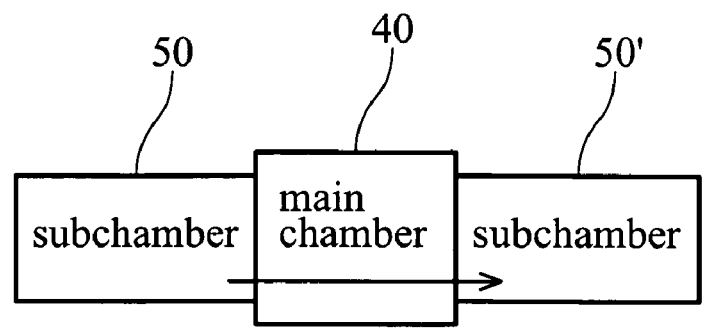
FIG. 4b shows a first modified example of the second embodiment of the invention.

FIG. 4b shows a first modified example of the second embodiment, wherein detailed structures in the main chamber and the subchamber are not shown to simplify the description. With reference to FIG. 4b, the first modified example of the second embodiment comprises subchambers 50 and 50' which are connected to the main chamber 40. Before defect detection, the array 23 is placed in the subchamber 50 for heating to the second temperature. The array 23 is then moved to the main chamber 40 to be detected. After defect detection, the array 23 is moved to the subchamber 50' from the main chamber 40 to be uniformly cooled to the second temperature. The first modified example of the second embodiment further shortens the preheating and cooling time of the array 23.

Figure 4C:
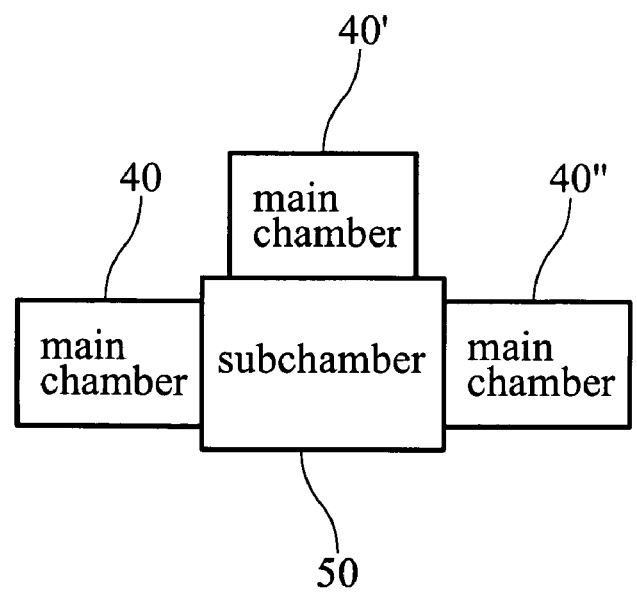
FIG. 4c shows a second modified example of the second embodiment of the invention.

FIG. 4c shows a second modified example of the second embodiment, wherein detailed structures in the main chamber and the subchamber are not shown to simplify the description. With reference to FIG. 4c, the second modified example of the second embodiment comprises three main chambers 40, 40' and 40" connected to the subchamber 50.

Before defect detection, the array 23 is placed in the subchamber 50 for heating to the second temperature. Then, the array 23 is moved to the main chamber 40, 40' or 40" to be detected. After defect detection, the array 23 is moved back to the subchamber 50 from the main chamber 40, 40' or 40" to be uniformly cooled to the second temperature. The second modified example of the second embodiment further reduces the detection time of the array 23.

The apparatus of the invention locates the defect of the TFT directly after an array process, especially to the defect highly related to the high temperature. Therefore, the defect can be removed before a cell process and a backlight module packaging process. The cost for manufacturing a panel is apparently reduced.

While the invention has been described by way of example and in terms of preferred embodiment, it is to be understood that the invention is not limited there to. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A detection apparatus for detecting a defect of a TFT array of a liquid crystal display, comprising:
   a main chamber;
   a stage disposed in the main chamber for placing the TFT array thereon;

a detection device disposed in the main chamber for detecting an electrical characteristic of the TFT array;

a main heater for heating the TFT array to a first temperature to reveal defects in the TFT array;

a subchamber connected to the main chamber; and a subheater preheating the TFT array to a second temperature;

wherein the second temperature is lower than the first temperature.

2. The detection apparatus as claimed in claim 1, wherein the detection device is an electron beam detection device, comprises an electron beam source and a sensor, the electron beam source emitting an electron beam toward the TFT array, the sensor detecting a plurality of secondary electrons generated from the TFT array to detect the electrical characteristics of the TFT array.

3. The detection apparatus as claimed in claim 2, wherein the electron beam source emits the electron beam toward a transparent electrode of the TFT array.

4. The detection apparatus as claimed in claim 1, wherein the defect is a weak TFT.

5. The detection apparatus as claimed in claim 1, wherein the first temperature is between 20 to 150° C.

6. The detection apparatus as claimed in claim 1, wherein the main heater heats the TFT array by lamp, infrared rays, cold wall heating or hot wall heating.

7. The detection apparatus as claimed in claim 1, wherein after the detection device detects the TFT array, the TFT array is uniformly cooled to the second temperature in the subchamber.

8. The detection apparatus as claimed in claim 1, wherein the liquid crystal display is an amorphous silicon TFT LCD, a poly-silicon TFT LCD, an active-matrix organic electroluminescence display or a active-matrix flat panel display.

9. A detection apparatus for detecting a defect of a TFT array of a liquid crystal display, comprising:

a stage for placing the TFT array thereon;

a detection device for detecting an electrical characteristic of the TFT array; and a heater for heating the TFT array to a first temperature to reveal the defect of the TFT array;

wherein the heater preheats the TFT array by convection or conduction to a second temperature lower than the first temperature before the TFT array being heated to the first temperature.

10. The detection apparatus as claimed in claim 9, wherein the detection device is an electron beam detection device, comprises an electron beam source and a sensor, the electron beam source emitting an electron beam toward the TFT array, the sensor detecting a plurality of secondary electrons generated from the TFT array to detect the electrical characteristics of the TFT array.

11. The detection apparatus as claimed in claim 10, wherein the electron beam source emits the electron beam toward a transparent electrode of the TFT array.

12. The detection apparatus as claimed in claim 9, wherein the defect is TFT weak.

13. The detection apparatus as claimed in claim 9, wherein the first temperature is between 20 to 150° C.

14. The detection apparatus as claimed in claim 9, wherein the heater heats the TFT array by lamp, infrared rays or heating coil.

15. The detection apparatus as claimed in claim 9, wherein the TFT array is cooled by convection or conduction after the detection device detects the TFT array, as the temperature of the TFT array is down to a second temperature lower than the first temperature.

16. The detection apparatus as claimed in claim 9, wherein the liquid crystal display is an amorphous silicon TFT LCD, a poly-silicon TFT LCD, an active-matrix organic electroluminescent display or a active-matrix flat panel display.

17. A detection method for detecting a defect of a TFT array of a liquid crystal display, comprising:

providing a detection device and a heater;

heating the TFT array to a first temperature by the heater;

detecting an electrical characteristic of the TFT array by the detection device; and preheating the TFT array by the heater by convection or conduction to a second temperature lower than the first temperature before the TFT array being heated to the first temperature.

18. The detection method as claimed in claim 17, wherein the detection device is an electron beam detection device, comprises an electron beam source and a sensor, the electron beam source emitting an electron beam toward the TFT array, the sensor detecting a plurality of secondary electrons generated from the TFT array to detect the electrical characteristics of the TFT array.

19. The detection method as claimed in claim 18, wherein the electron beam source emits the electron beam toward a transparent electrode of the TFT array.

20. The detection method as claimed in claim 17, wherein the defect is TFT weak.

21. The detection method as claimed in claim 17, wherein the first temperature is between 20 to 150° C.

22. The detection method as claimed in claim 17, wherein the heater heats the TFT array by lamp, infrared rays, cold wall heating, hot wall heating or heating coil.

* * * * *